United States Patent
Gai et al.

(10) Patent No.: US 10,629,747 B2
(45) Date of Patent: Apr. 21, 2020

(54) THIN FILM TRANSISTOR, MANUFACTURING METHOD THEREOF, ARRAY SUBSTRATE AND MANUFACTURING METHOD THEREOF

(71) Applicant: BOE TECHNOLOGY GROUP CO., LTD., Beijing (CN)

(72) Inventors: Cuili Gai, Beijing (CN); Ling Wang, Beijing (CN); Baoxia Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/078,750

(22) PCT Filed: Jan. 4, 2018

(86) PCT No.: PCT/CN2018/071310
§ 371 (c)(1),
(2) Date: Aug. 22, 2018

(87) PCT Pub. No.: WO2018/201748
PCT Pub. Date: Nov. 8, 2018

(65) Prior Publication Data
US 2019/0280127 A1    Sep. 12, 2019

(30) Foreign Application Priority Data
May 5, 2017    (CN) .......................... 2017 1 0311944

(51) Int. Cl.
*H01L 31/00*    (2006.01)
*H01L 29/786*    (2006.01)
(Continued)

(52) U.S. Cl.
CPC ........ *H01L 29/78633* (2013.01); *H01L 27/12* (2013.01); *H01L 27/1222* (2013.01); *H01L 29/66757* (2013.01); *H01L 29/786* (2013.01)

(58) Field of Classification Search
CPC ............. H01L 29/786; H01L 29/78633; H01L 29/66757; H01L 27/1222
See application file for complete search history.

(56) References Cited

U.S. PATENT DOCUMENTS 8,879,014 B2    11/2014    Liu
9,647,009 B1    5/2017    Zhao et al.
(Continued)

FOREIGN PATENT DOCUMENTS

CN    101807583 A    8/2010
CN    105572998 A    5/2016
(Continued)

OTHER PUBLICATIONS

International Search Report and Written Opinion dated Apr. 3, 2018 from State Intellectual Property Office of the P.R. China.
(Continued)

*Primary Examiner* — Phuc T Dang
(74) *Attorney, Agent, or Firm* — Dilworth & Barrese, LLP.; Michael J. Musella, Esq.

(57) ABSTRACT

A thin film transistor, a manufacturing method of the thin film transistor, an array substrate and a manufacturing method of the array substrate are provided. The thin film transistor includes a base substrate, a metal light-shielding layer and a first active layer which are on the base substrate, and a spacer layer between the first active layer and the metal light-shielding layer; the first active layer includes a channel region, and the spacer layer is between the channel region and the metal light-shielding layer.

14 Claims, 6 Drawing Sheets

(51) Int. Cl.
*H01L 27/12* (2006.01)
*H01L 29/66* (2006.01)

(56) References Cited

U.S. PATENT DOCUMENTS

| | | | |
|---|---|---|---|
| 10,120,247 B2 | 11/2018 | Ge | |
| 10,379,413 B2 | 8/2019 | Wang et al. | |
| 2001/0005019 A1 | 6/2001 | Ishikawa | |
| 2002/0158298 A1* | 10/2002 | Yamada | H01L 27/12 257/471 |
| 2011/0122352 A1* | 5/2011 | Tae | G02F 1/13318 349/138 |
| 2016/0049479 A1* | 2/2016 | Liu | H01L 29/41733 257/72 |

FOREIGN PATENT DOCUMENTS

| | | |
|---|---|---|
| CN | 105633016 A | 6/2016 |
| CN | 105679765 A | 6/2016 |

OTHER PUBLICATIONS

Website: PenTile matrix family: https://en.wikipedia.org/wiki/PenTile_matrix_family.
English Abstract of "Stable RGBW AMOLED display with OLED degradation compensation using electrical feedback" G. Reza Chaji et al. 2010 IEEE International Solid-State Circuits Conferences—(ISSCC).
First Chinese Office Action dated Mar. 4, 2020.

\* cited by examiner

THIN FILM TRANSISTOR, MANUFACTURING METHOD THEREOF, ARRAY SUBSTRATE AND MANUFACTURING METHOD THEREOF

This application claims the benefit of Chinese Patent Application No. 201710311944.4 filed on May 5, 2017, which is hereby entirely incorporated by reference as a part of the present application.

TECHNICAL FIELD

At least one embodiment of the present disclosure relates to a thin film transistor, a manufacturing method of the thin film transistor, an array substrate and a manufacturing method of the array substrate.

BACKGROUND

In the case where the active layer of a thin film transistor is irradiated by light, photocarriers in the active layer increases and results in an increased leakage current of the thin film transistor. To avoid the above phenomenon, a light-shielding layer is generally provided in the thin film transistor to prevent the light from being irradiated onto the active layer. However, in the case where the light-shielding layer is formed of a metal material, a parasitic capacitance is generated between the light-shielding layer and the active layer. This parasitic capacitance causes the leakage current of the thin film transistor to increase and affects the electrical properties of the thin film transistor.

SUMMARY

At least one embodiment of the present disclosure provides a thin film transistor, which includes a base substrate, a metal light-shielding layer and a first active layer which are on the base substrate, and a spacer layer between the first active layer and the metal light-shielding layer; the first active layer includes a channel region, and the spacer layer is between the channel region and the metal light-shielding layer.

For example, the thin film transistor provided by at least one embodiment of the present disclosure further includes a buffer layer between the first active layer and the metal light-shielding layer.

For example, in the thin film transistor provided by at least one embodiment of the present disclosure, the spacer layer is an insulating material; and the spacer layer is between the first active layer and the buffer layer, and/or the spacer layer is between the metal light-shielding layer and the buffer layer.

For example, in the thin film transistor provided by at least one embodiment of the present disclosure, the spacer layer serves as a second active layer, the second active layer is between the first active layer and the buffer layer, and a resistivity of the second active layer is greater than a resistivity of the first active layer.

For example, in the thin film transistor provided by at least one embodiment of the present disclosure, in a direction perpendicular to the base substrate, an orthographic projection of the spacer layer on the base substrate at least partially overlaps an orthographic projection of the channel region of the first active layer on the base substrate.

For example, in the thin film transistor provided by at least one embodiment of the present disclosure, in the direction perpendicular to the base substrate, the orthographic projection of the spacer layer on the base substrate completely overlaps the orthographic projection of the channel region of the first active layer on the base substrate.

For example, in the thin film transistor provided by at least one embodiment of the present disclosure, in the direction perpendicular to the base substrate, the orthographic projection of the spacer layer on the base substrate completely overlaps an orthographic projection of the first active layer on the base substrate.

At least one embodiment of the present disclosure provides an array substrate which includes the thin film transistor according to any one of the above embodiments.

For example, the array substrate provided by at least one embodiment of the present disclosure further includes a storage capacitor on the base substrate, and the storage capacitor includes a first electrode, a second electrode and a dielectric layer between the first electrode and the second electrode.

For example, in the array substrate provided by at least one embodiment of the present disclosure, the metal light-shielding layer of the thin film transistor and the first electrode are in a same layer and are formed of a same material; and/or the thin film transistor includes a gate electrode, and the gate electrode and the second electrode are in a same layer and are formed of a same material.

For example, in the array substrate provided by at least one embodiment of the present disclosure, a portion of the buffer layer serves as the dielectric layer.

For example, in the array substrate provided by at least one embodiment of the present disclosure, the spacer layer and the storage capacitor are spaced apart from each other.

At least one embodiment of the present disclosure provides a manufacturing method of a thin film transistor, which includes: providing a base substrate; forming a light-shielding layer and a first active layer on the base substrate; and forming a spacer layer between the first active layer and the metal light-shielding layer, so that the first active layer includes a channel region, and the spacer layer is formed between the channel region and the metal light-shielding layer.

For example, the manufacturing method provided by at least one embodiment of the present disclosure further includes: forming a buffer layer between the first active layer and the metal light-shielding layer.

For example, in the manufacturing method provided by at least one embodiment of the present disclosure, the spacer layer is an insulating layer; and the spacer layer is formed between the first active layer and the buffer layer, and/or the spacer layer is formed between the metal light-shielding layer and the buffer layer.

For example, in the manufacturing method provided by at least one embodiment of the present disclosure, the spacer layer serves as a second active layer; and the second active layer is formed between the first active layer and the buffer layer, and a resistivity of the second active layer is greater than a resistivity of the first active layer.

For example, in the manufacturing method provided by at least one embodiment of the present disclosure, forming the first active layer on the base substrate includes: forming a first semiconductor film on the base substrate, and patterning the first semiconductor film by using a first mask to form the first active layer; and forming the spacer layer on the base substrate includes: forming a spacer film on the base substrate, and patterning the spacer film by using the first mask to form the spacer layer.

At least one embodiment of the present disclosure provides a manufacturing method of an array substrate, and the method includes the manufacturing method of the thin film transistor according to any one of the above embodiments.

For example, the manufacturing method of the array substrate provided by at least one embodiment of the present disclosure further includes: forming a storage capacitor on the base substrate, so that the storage capacitor includes a first electrode, a second electrode, and a dielectric layer between the first electrode and the second electrode.

For example, in the manufacturing method of the array substrate provided by at least one embodiment of the present disclosure, the spacer layer and the storage capacitor are spaced apart from each other.

The thin film transistor, the manufacturing method of the thin film transistor, the array substrate and the manufacturing method of the array substrate provided by at least one embodiment of the present disclosure reduce or eliminate a parasitic capacitance between the channel region of the first active layer and the metal light-shielding layer, and improve electrical properties of the thin film transistor.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b is a schematic view of a partial structure of the thin film transistor shown in FIG. 1a;

REFERENCE SIGNS

100—base substrate; 200—metal light-shielding layer; 300—buffer layer; 400—space layer; 500—first active layer; 510—source region; 520—drain region; 530—channel region; 600—gate insulating layer; 700—gate electrode; 800—interlayer dielectric layer; 801—passivation layer; 810—first via hole; 820—second via hole; 900—source/drain electrode layer; 910—source electrode; 920—drain electrode; 1100—first electrode; 1200—second electrode; 1300—second dielectric layer.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
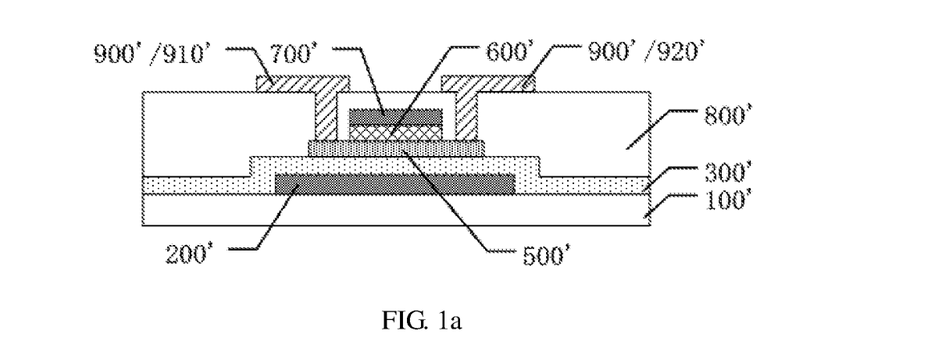
FIG. 1a is a cross-sectional view of a thin film transistor.
Figure 1B:
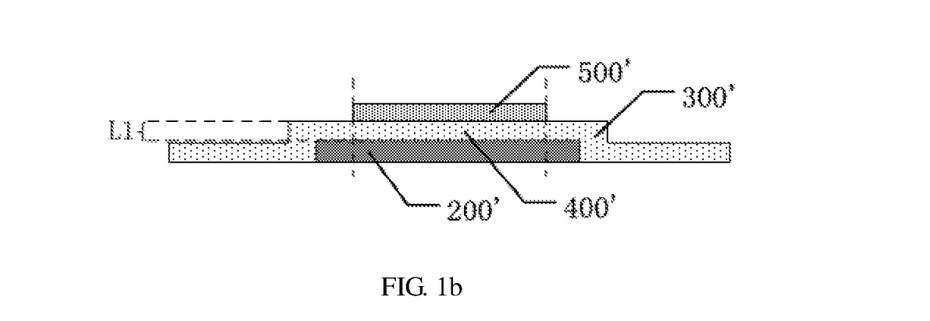

FIG. 1a is a cross-sectional view of a thin film transistor, and FIG. 1b is a schematic view of a partial structure of the thin film transistor shown in FIG. 1a. For example, as shown in FIG. 1a and FIG. 1b, the thin film transistor includes a base substrate 100', and a metal light-shielding layer 200', a buffer layer 300', an active layer 500', a gate insulating layer 600', a gate electrode 700', a source/drain electrode layer 900' and other structures which are on the base substrate 100'. The metal light-shielding layer 200' prevents light from being incident on the active layer 500' from the side, provided with the base substrate 100', of the active layer 500'. However, because the distance L1 between the metal light-shielding layer 200' and the active layer 500' is small, a parasitic capacitance is generated between the metal light-shielding layer 200' and the active layer 500'. This parasitic capacitance causes a back channel effect in the thin film transistor, and thus causes the threshold voltage of the thin film transistor to drift and increases the leakage current of the thin film transistor.

At least one embodiment of the present disclosure provides a thin film transistor, a manufacturing method of the thin film transistor, an array substrate and a manufacturing method of the array substrate. The thin film transistor includes: a base substrate; a metal light-shielding layer and a first active layer which are on the base substrate; and a spacer layer which is between the first active layer and the metal light-shielding layer; the first active layer includes a channel region, and the spacer layer is located between the channel region and the metal light-shielding layer. The spacer layer increases the distance between the first active layer and the metal light-shielding layer of the thin film transistor, in particular, increases the distance between the channel region of the first active layer and the metal light-shielding layer, so that the parasitic capacitance between the first active layer (especially the channel region of the first active layer) and the metal light-shielding layer is reduced or eliminated and the electrical properties of the thin film transistor are improved.

For example, the thin film transistor provided by at least one embodiment of the present disclosure is applied to an array substrate, the array substrate includes a plurality of pixel units, each of at least a part of the pixel units is provided with the thin film transistor as described above, so that there are a plurality of the spacer layers on the array substrate. For example, in the array substrate, the plurality of the spacer layers are spaced apart from each other. For example, each of the pixel units includes the thin film transistor and a pixel electrode connected to the thin film transistor, the pixel electrode is located in a display region of the pixel unit, and the thin film transistor is located in a non-display region of the pixel unit, so the spacer layer of the thin film transistor is also located in the non-display region of the pixel unit. For example, the spacer layer is only in the non-display region of the pixel unit.

The thin film transistor, the manufacturing method of the thin film transistor, the array substrate and the manufacturing method of the array substrate according to at least one embodiment of the present disclosure will be described in detail below with reference to the accompanying drawings.

Figure 2A:
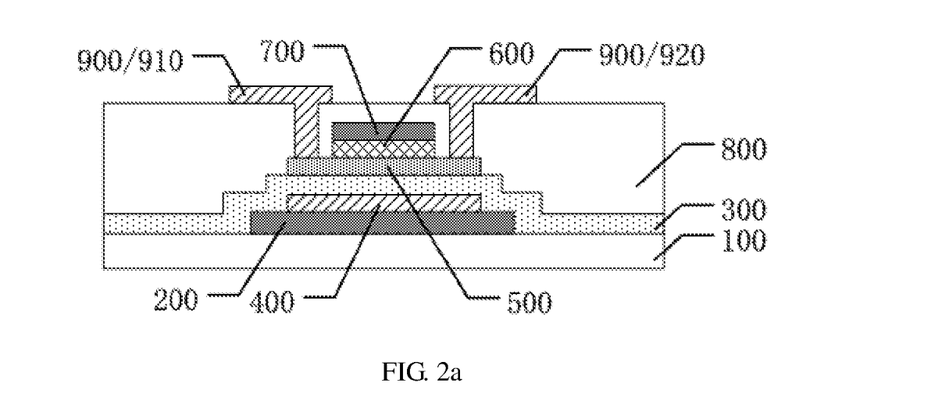
FIG. 2a is a cross-sectional view of a thin film transistor provided by at least one embodiment of the present disclosure.

At least one embodiment of the present disclosure provides the thin film transistor, and FIG. 2a is a cross-sectional view of the thin film transistor provided by at least one embodiment of the present disclosure. For example, as shown in FIG. 2a, the thin film transistor includes: a base substrate 100; a metal light-shielding layer 200, a first active layer 500, a gate electrode 700, and a source/drain electrode layer 900 (for example, including a source electrode 910 and a drain electrode 920) which are disposed on the base substrate 100; and a spacer layer 400 disposed between the first active layer 500 and the metal light-shielding layer 200. The first active layer 500 includes a channel region 530 (referring to FIG. 2c) and the spacer layer 400 is disposed between the channel region and the metal light-shielding layer 500. In this way, the spacer layer 400 increases the distance between the first active layer 500 and the metal light-shielding layer 200, reduces or eliminates the parasitic capacitance between the first active layer 500 (for example, the channel region 530 of the first active layer 500) and the metal light-shielding layer 200, thus reduces the leakage current in the thin film transistor and improves the electrical properties of the thin film transistor.

It should be noted that, as long as the spacer layer 400 is disposed between the channel region 530 of the first active layer 500 and the metal light-shielding layer 200, the distance between the channel region 530 and the metal light-shielding layer 200 is increased and the parasitic capacitance between the channel region 530 and the metal light-shielding layer 200 is reduced or eliminated. Therefore, in the embodiments of the present disclosure, in a direction perpendicular to the base substrate 100, a thickness of the spacer layer 400 is not limited as long as the parasitic capacitance between the channel region 530 of the first active layer 500 and the metal light-shielding layer 200 is reduced or eliminated due to the existence of the spacer layer 400. For example, the thickness of the spacer layer 400 may be determined according to actual requirements. For example, in at least one embodiment of the present disclosure, the spacer layer 400 is configured such that the distance between the channel region 530 of the first active layer 500 and the metal light-shielding layer 200 is not smaller than 1 micron.

For example, in at least one embodiment of the present disclosure, in the direction perpendicular to the base substrate 100, a projection of the spacer layer 400 on the base substrate 100 at least partially overlaps a projection of the channel region 530 of the first active layer 500 on the base substrate 100. As long as the spacer layer 400 increases the distance between at least a portion of the channel region 530 of the first active layer 500 and the metal light-shielding layer 200, the parasitic capacitance between the first active layer 500 and the metal light-shielding layer 200 is reduced or eliminated. The embodiments of the present disclosure do not limit the size and the position of the spacer layer 400. For example, in some embodiments of the present disclosure, the spacer layer 400 is provided to increase the distance between a portion of the channel region of the first active layer 500 and the metal light-shielding layer 200; or, for example, in some embodiments of the present disclosure, the spacer layer 400 is provided to increase the distance between an entirety of the channel region of the first active layer 500 and the metal light-shielding layer 200; or for example, in some embodiments of the present disclosure, the spacer layer 400 is provided to increase the distance between an entirety of the first active layer 500 and the metal light-shielding layer 200.

The arrangement manners of the spacer layer 400 according to the embodiments of the present disclosure will be described below by a plurality of examples.

Figure 2B:
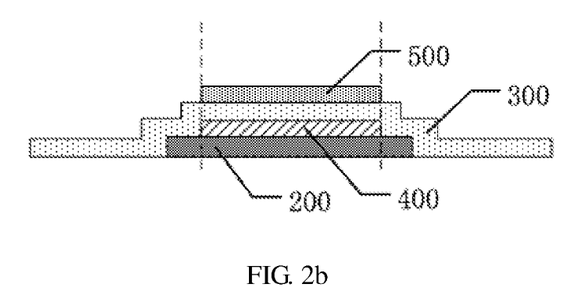
FIG. 2b is a schematic view of an arrangement of a spacer layer of the thin film transistor according to at least one embodiment of the present disclosure.

FIG. 2b is a schematic view of an arrangement of the spacer layer of the thin film transistor according to at least one embodiment of the present disclosure, which is a schematic view of a partial structure of the thin film transistor. For example, in one example of the embodiments of the present disclosure, as shown in FIG. 2b, in the direction perpendicular to the base substrate 100, the projection of the spacer layer 400 on the base substrate 100 completely overlaps the projection of the first active layer 500 on the base substrate 100, that is, the spacer layer 400 increases the distance between the entirety of the first active layer 500 and the metal light-shielding layer 200, so that the parasitic capacitance between the first active layer 500 and the metal light-shielding layer 200 is reduced or eliminated. In addition, because the projection of the spacer layer 400 on the base substrate 100 completely overlaps the projection of the first active layer 500 on the base substrate 100, for example, a same mask is used to respectively manufacture the first active layer 500 and the spacer layer 400 during the production process of the thin film transistor; that is, the spacer layer 400 is manufactured by using the mask for manufacturing the first active layer 500, so that the production cost is reduced.

Figure 2C:
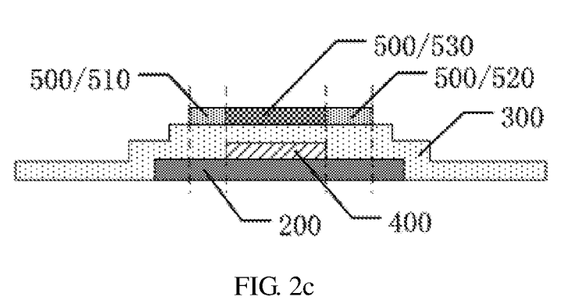
FIG. 2c is a schematic view of another arrangement of the spacer layer of the thin film transistor according to at least one embodiment of the present disclosure.

FIG. 2c is a schematic view of another arrangement of the spacer layer of the thin film transistor according to at least one embodiment of the present disclosure, which is a schematic view of the partial structure of the thin film transistor. For example, in at least one embodiment of the present disclosure, as shown in FIG. 2c, the first active layer 500 includes a source region 510, a drain region 520 and the channel region 530 between the source region 510 and the drain region 520. The source region 510 is electrically connected with the source electrode 910, and the drain region 520 is electrically connected with the drain electrode 920. For example, the source region 510 and the drain region 520 are formed by performing an ion doping process on the first active layer 500 which is formed of a semiconductor material, and a portion of the first active layer 500 that is not ion-doped is the channel region 530. After the ion doping process, the electrical properties of the source region 510 and the drain region 520 are improved, and the electrical connection between the first active layer 500 and each of the source electrode 910 and the drain electrode 920 is enhanced. For example, each of the source region 510 and the drain region 520 further includes a heavily doped region and a lightly doped region, and the lightly doped region is between the heavily doped region and the channel region 530. For example, the gate electrode 700 corresponds to the channel region 530 so that a voltage applied on the gate electrode 700 affects the electrical properties of the channel region 530 to realize the switching-on of the thin film transistor. For example, the orthographic projection of the channel region 530 on the base substrate 100 completely overlaps the orthographic projection of the gate electrode 700 on the base substrate 100. For example, the first active layer 500 is ion-doped by using the gate electrode 700 as a mask during manufacturing the thin film transistor.

For example, in at least one embodiment of the present disclosure, in the direction perpendicular to the base substrate 100, the projection of the spacer layer 400 on the base substrate 100 completely overlaps the projection of the channel region 530 of the first active layer 500 on the base substrate 100, i.e., the spacer layer 400 is provided to increase the distance between the entirety of the channel region 530 of the first active layer 500 and the metal light-shielding layer 200. As long as the spacer layer 400 spaces the channel region 530 of the first active layer 500 apart from the metal light-shielding layer 200, the parasitic capacitance between the channel region 530 of the first active layer 500 and the metal light-shielding layer 200 is reduced or eliminated.

Figure 2D:
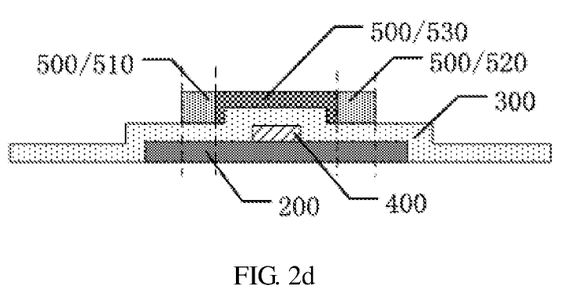
FIG. 2d is a schematic view of still another arrangement of the spacer layer of the thin film transistor according to at least one embodiment of the present disclosure.

FIG. 2d is a schematic view of another arrangement of the spacer layer of the thin film transistor according to at least one embodiment of the present disclosure, which is a schematic view of the partial structure of the thin film transistor. For example, in another example of the embodiments of the present disclosure, as shown in FIG. 2d, in the direction perpendicular to the base substrate 100, the projection of the spacer layer 400 on the base substrate 100 is located within the projection of the channel region of the first active layer 500 on the base substrate 100, that is, the spacer layer 400 is provided to increase the distance between a portion of the channel region 530 of the first active layer 500 and the metal light-shielding layer 200. As such, the parasitic capacitance generated between the channel region 530 and the metal light-shielding layer 200 is reduced, so the arrangement of the spacer layer 400 still reduces the parasitic capacitance between the first active layer 500 and the metal light-shielding layer 200.

For example, in at least one embodiment of the present disclosure, the thin film transistor is a top gate type thin film transistor or a bottom gate type thin film transistor or the like. In at least one embodiment of the present disclosure, the type of the thin film transistor is not limited, as long as the metal light-shielding layer needs to be provided in the thin film transistor to shield the first active layer from being irradiated by light.

For example, in at least one embodiment of the present disclosure, the thin film transistor is the top gate type thin film transistor. As shown in FIG. 2a, the top gate type thin film transistor provided by at least one embodiment of the present disclosure includes the base substrate 100, and the metal light-shielding layer 200, the spacer layer 400, the first active layer 500, the gate insulating layer 600, the gate electrode 700, the interlayer dielectric layer 800 and the source/drain electrode layer 900 which are sequentially provided on the base substrate 100.

Figure 3:
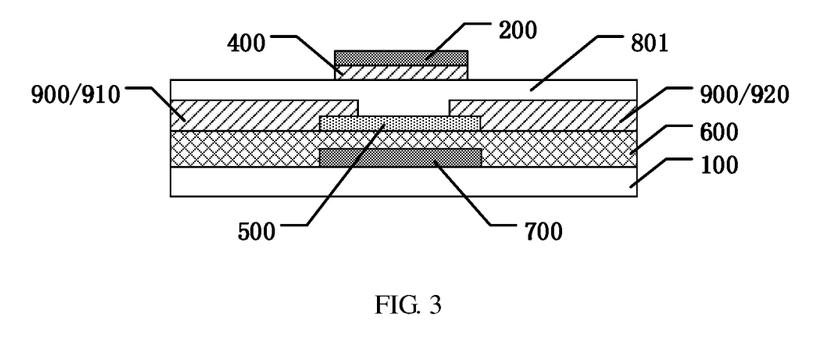
FIG. 3 is another cross-sectional view of the thin film transistor provided by at least one embodiment of the present disclosure.

For example, in at least one embodiment of the present disclosure, the thin film transistor is the bottom-gate type thin film transistor, and FIG. 3 is another cross-sectional view of the thin film transistor provided by at least one embodiment of the present disclosure. For example, as shown in FIG. 3, the bottom gate type thin film transistor provided by at least one embodiment of the present disclosure includes the base substrate 100, and the gate electrode 700, the gate insulating layer 600, the first active layer 500, the source/drain electrode layer 900, the passivation layer 801, the spacer layer 400 and the metal light-shielding layer 200 which are sequentially disposed on the base substrate 100. The metal light-shielding layer 200 prevents the irradiation of light on the first active layer 500 from the upper side of the first active layer 500 (namely, the metal light-shielding layer 200 prevents the light from irradiating the first active layer 500 from the side of the first active layer 500 away from the base substrate 100). In the thin film transistor shown in FIG. 3, in the case that the passivation layer 801 is too thin, the distance between the first active layer 500 and the metal light-shielding layer 200 is small, and the parasitic capacitance is still generated between the first active layer 500 and the metal light-shielding layer 200; in this case, the existence of the spacer layer 400 increases the distance between the metal light-shielding layer 200 and the first active layer 500, and thus reduces the parasitic capacitance between the metal light-shielding layer 200 and the first active layer 500 (especially between the metal light-shielding layer 200 and the channel region of the first active layer 500).

For example, the material of the passivation layer 801 includes silicon nitride (SiNx), or silicon oxide (SiOx), or the like, which is not limited in the embodiments of the present disclosure. The materials of other structures in the bottom gate type thin film transistor may be referred to the materials of structures in the top gate type thin film transistor. Here, descriptions related to the materials of the structures in the bottom gate type thin film transistor are omitted.

For example, in at least one embodiment of the present disclosure, the spacer layer 400 is disposed between the metal light-shielding layer 200 and the passivation layer 801 or is disposed between the passivation layer 801 and the first active layer 500, as long as the spacer layer 400 is located between the metal light-shielding layer 200 and the first active layer 500. The embodiments of the present disclosure do not limit the position of the spacer layer 400.

In the following, the top gate type thin film transistor shown in FIG. 2a is taken as an example, and the technical solutions in the embodiments of the present disclosure will be further described.

For example, in at least one embodiment of the present disclosure, as shown in FIG. 2a, the thin film transistor further includes a buffer layer 300 disposed between the first active layer 500 and the metal light-shielding layer 200. The buffer layer 300 acts as a transition layer, so that the first active layer 500 and the base substrate 100 are more firmly bonded together, and that harmful impurities, ions or the like in the base substrate 100 or in the metal light-shielding layer 200 are prevented from being diffused into the first active layer 500. For example, the orthographic projection of the spacer layer 400 on the base substrate 100 is within the orthographic projection of the buffer layer 300 on the base substrate 100, and the orthographic projection of the spacer layer 400 on the base substrate 100 is smaller than the orthographic projection of the buffer layer 300 on the base substrate 100.

For example, in at least one embodiment of the present disclosure, as shown in FIG. 2a, the spacer layer 400 is disposed between the buffer layer 300 and the metal light-shielding layer 200. For example, the spacer layer 400 is an insulating layer formed of an insulating material, and the insulating material includes, for example, silicon nitride or silicon oxide or the like. For example, the material for manufacturing the spacer layer 400 is the same as the material for manufacturing the buffer layer 300, the gate insulating layer 600, or the interlayer dielectric layer 800, so as to reduce the production cost.

Figure 4:
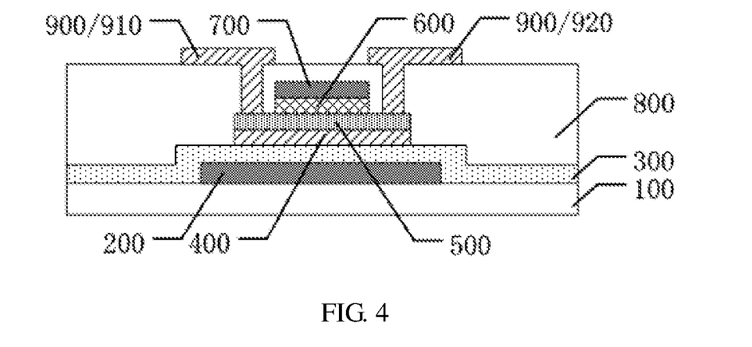
FIG. 4 is still another cross-sectional view of the thin film transistor provided by at least one embodiment of the present disclosure.

FIG. 4 is still another cross-sectional view of the thin film transistor provided by at least one embodiment of the present disclosure. For example, in at least one embodiment of the present disclosure, as shown in FIG. 4, the spacer layer 400 is disposed between the first active layer 500 and the buffer layer 300. For example, the spacer layer 400 is an insulating layer made of an insulating material.

For example, in at least one embodiment of the present disclosure, as shown in FIG. 4, the spacer layer 400 is disposed between the first active layer 500 and the buffer layer 300, the spacer layer 400 serves as a second active layer, and a resistivity of the spacer layer 400 is greater than a resistivity of the first active layer 500. In this case, for example, the spacer layer 400 is formed of a semiconductor material. Because each of the first active layer 500 and the second active layer (i.e. the spacer layer) 400 is formed of the semiconductor material, for example, the same mask is used to obtain the first active layer 500 and the second active layer 400 simultaneously in the same patterning process, so as to simplify the manufacturing process of the thin film transistor.

The resistivity of the second active layer 400 is greater than the resistivity of the first active layer 500 so that carriers (holes or electrons) in the thin film transistor mainly transport in the first active layer 500; and the second active layer 400 increases the distance between the first active layer 500 and the metal light-shielding layer 200, so that the parasitic capacitance between the first active layer 500 and the metal light-shielding layer 200 is reduced, namely, the drift value of the threshold voltage of the first active layer 500 caused by the parasitic capacitance is reduced, and thus the amount of increase in leakage current caused due to that the first active layer 500 is influenced by the parasitic capacitance is reduced. In at least one embodiment of the present disclosure, there are various methods to achieve that the resistivity of the second active layer 400 is greater than the resistivity of the first active layer 500. For example, the semiconductor material for manufacturing the second active layer 400 has a higher resistivity than the semiconductor material for manufacturing the first active layer 500. For example, the semiconductor material for manufacturing the second active layer 400 is amorphous silicon, and the semiconductor material for manufacturing the first active layer 500 is polysilicon. For example, by adopting a doping process, the resistivity of the second active layer 400 is greater than the resistivity of the first active layer 500.

It should be noted that in the thin film transistor provided in at least one embodiment of the present disclosure, one spacer layer 400 is disposed between the first active layer 500 and the metal light-shielding layer 200, or two or more spacer layers 400 are disposed between the first active layer 500 and the metal light-shielding layer 200. At least one embodiment of the present disclosure imposes no limitation on the number of the spacer layers 400. For example, the spacer layer 400 is provided between the buffer layer 300 and the first active layer 500 and the spacer layer 400 is further provided between the buffer layer 300 and the metal light-shielding layer 200.

At least one embodiment of the present disclosure provides an array substrate, which includes the thin film transistor in any one of the above embodiments.

Figure 5:
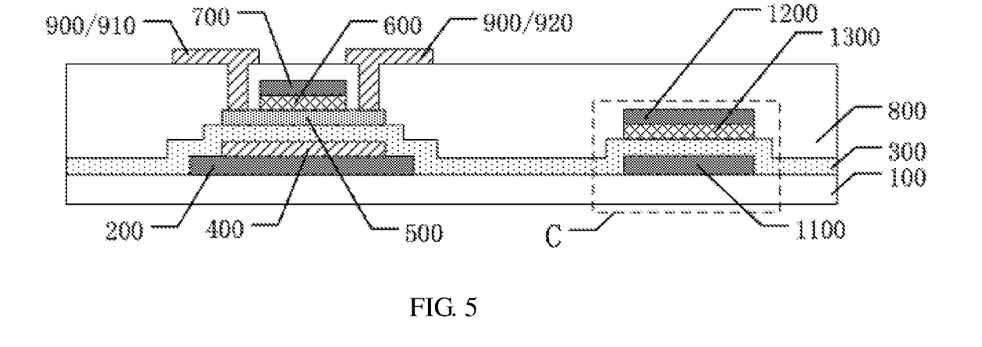
FIG. 5 is a cross-sectional view of an array substrate provided by at least one embodiment of the present disclosure.

For example, in at least one embodiment of the present disclosure, the array substrate further includes a storage capacitor. FIG. 5 is a cross-sectional view of the array substrate provided by at least one embodiment of the present disclosure. For example, as shown in FIG. 5, the array substrate provided in at least one embodiment of the present disclosure further includes the storage capacitor C located on the base substrate 100. For example, the storage capacitor C includes a first electrode 1100, a second electrode 1200 and a dielectric layer between the first electrode 1100 and the second electrode 1200.

It should be noted that, in at least one embodiment of the present disclosure, the materials, arrangements, and the like of the first electrode 1100, the second electrode 1200, and the dielectric layer in the storage capacitor C are not limited. For example, the storage capacitor C is prepared simultaneously during the preparation of the thin film transistor, to reduce the cost of the production process.

For example, the array substrate includes a plurality of pixel units defined by crossing gate lines and data lines with each other, and each pixel unit is provided with the pixel electrode and the thin film transistor that controls the switching of the pixel electrode. In the case where a scanning signal (for example, a voltage signal) transmitted by the gate line renders the thin film transistor to be in the on state, a voltage signal transmitted by the data line is applied to the pixel electrode of the pixel unit, so that the pixel unit achieves image display. In order to achieve a high quality display effect, the voltage applied to the pixel electrode needs to maintain at a certain constant value until the next scanning signal arrives. However, electric charges on the pixel electrode used to maintain the voltage generally leaks rapidly, and this causes the voltage of the pixel electrode to drop prematurely and thus reduces the display effect. Therefore, for example, the storage capacitor is provided in each pixel unit, and the storage capacitor is configured to keep the voltage of the pixel electrode at the certain constant value for a predetermined time period.

It should be noted that, in the array substrate provided by at least one embodiment of the present disclosure, the specific connection position of each of the first electrode 1100 and the second electrode 1200 of the storage capacitor C is not limited, as long as the storage capacitor C maintains the voltage of the pixel electrode in the pixel unit. For example, the second electrode 1200 of the storage capacitor C is electrically connected with the pixel electrode in the pixel unit, and the first electrode 1100 of the storage capacitor C is electrically connected with the gate line or a common electrode line which is disposed in the array substrate.

For example, in at least one embodiment of the present disclosure, as shown in FIG. 5, for example, the buffer layer 300 serves as the dielectric layer in the storage capacitor C.

In at least one embodiment of the present disclosure, a specific structure of the dielectric layer of the storage capacitor C is not limited. For example, the dielectric layer has a single-layer structure. For example, a portion of the buffer layer 300 between the first electrode 1100 and the second electrode 1200 is configured to serve as the dielectric layer of the storage capacitor C. For example, the dielectric layer has a structure of two or more layers. For example, in at least one embodiment of the present disclosure, as shown in FIG. 5, the dielectric layer in the storage capacitor C includes at least a first dielectric layer and a second dielectric layer 1300, and the buffer layer 300 serves as the first dielectric layer. For example, the second dielectric layer 1300 and the gate insulating layer 600 of the thin film transistor are disposed in a same layer and are formed of a same material.

For example, in at least one embodiment of the present disclosure, as shown in FIG. 5, the first electrode 1100 of the storage capacitor C and the metal light-shielding layer 200 of the thin film transistor are disposed in a same layer and are formed of a same material.

For example, in at least one embodiment of the present disclosure, as shown in FIG. 5, the second electrode 1200 of the storage capacitor C and the gate electrode 700 of the thin film transistor are disposed in a same layer and are formed of a same material.

It should be noted that, in at least one embodiment of the present disclosure, "a same layer" or "the same layer" refers to a layer structure comprises predetermined patterns, which are formed in way of firstly forming a film for forming the predetermined patterns by using the same film forming process with the same material, and then using the same mask to perform a patterning process on the film to obtain the predetermined patterns. Depending on the predetermined patterns, for example, the patterning process includes a plurality of steps such as exposure, development and etching. For example, the predetermined patterns in the layer structure are continuous or are discontinuous; for example, the predetermined patterns may be at different heights or have different thicknesses. Exemplarily, as shown in FIG. 5, taking the formation of the second electrode 1200 and the gate electrode 700 as an example, a conductive material film is deposited on the base substrate, then a patterning process is performed on the conductive material film to simultaneously form the second electrode 1200 and the gate electrode 700, in this case, the second electrode 1200 and the gate electrode 700 are disposed in the same layer, and the second electrode 1200 and the gate electrode 700 are spaced apart from each other and are at different heights (for example, the distance from the second electrode 1200 to the base substrate 100 and the distance from the gate electrode 700 to the base substrate 100 are different).

For example, in at least one embodiment of the present disclosure, as shown in FIG. 5, the spacer layer 400 and the storage capacitor C are disposed to be spaced apart from each other. As such, the spacer layer 400 increases the distance between the first active layer 500 and the metal light-shielding layer 200 which are in the thin film transistor and reduces or eliminates the parasitic capacitance between the first active layer 500 and the metal light-shielding layer 200, without affecting the capacitance of the storage capacitor C.

At least one embodiment of the present disclosure further provides a display panel including the array substrate in any one of the above embodiments.

One example of the display panel is a liquid crystal display panel including the array substrate and an opposite substrate, which are opposed to each other to form a liquid crystal cell, and a liquid crystal material layer is in the liquid crystal cell. The opposite substrate is, for example, a color filter substrate. The pixel electrode of each pixel unit of the array substrate is used to apply an electric field, so as to control the degree of rotation of liquid crystal molecules in the liquid crystal material layer to realize a display operation.

Another example of the display panel is an organic light-emitting diode (OLED) display panel in which a stack of organic light-emitting materials is formed in the array substrate, and an anode or a cathode of each pixel unit is used to drive the organic light-emitting materials in the pixel unit to emit light for display operation.

A further example of the display panel is an electronic paper display panel in which an electronic ink layer is formed in the array substrate, and the pixel electrode of each pixel unit is used to apply a voltage for driving charged particles in the electronic ink layer to move so as to perform a display operation.

At least one embodiment of the present disclosure provides a manufacturing method of a thin film transistor, which includes: providing a base substrate; forming a metal light-shielding layer and a first active layer on the base substrate; and forming a spacer layer between the first active layer and the metal light-shielding layer. The first active layer includes a channel region, and the spacer layer is formed between the channel region and the metal light-shielding layer. The spacer layer formed in the thin film transistor increases the distance between the channel region of the first active layer and the metal light-shielding layer, so as to reduce or eliminate the parasitic capacitance between the channel region of the first active layer and the metal light-shielding layer and to improve the electrical properties of the thin film transistor.

For example, the specific structure of the thin film transistor obtained by the above method may be referred to the related contents described in the foregoing embodiments (i.e. the embodiments of the thin film transistor), and details are not described herein.

In the following, the process of the manufacturing method is described in at least one example of the embodiments of the present disclosure. FIG. 6a to FIG. 6f are process views of the manufacturing method of the thin film transistor provided by at least one embodiment of the present disclosure. Taking the structure of the thin film transistor shown in FIG. 2a as an example, as shown in FIG. 6a to FIG. 6f, the manufacturing method of the thin film transistor in the example of the present disclosure includes the following process.

Figure 6A:
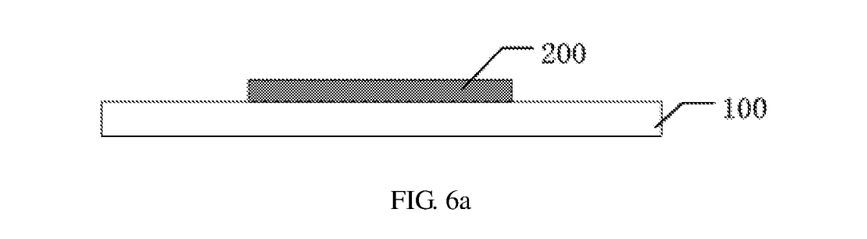
FIG. 6a to FIG. 6f are process views of a method for manufacturing the thin film transistor provided by at least one embodiment of the present disclosure.

As shown in FIG. 6a, a base substrate 100 is provided, and a metal light-shielding layer 200 is formed on the base substrate 100. For example, a metal film is deposited on the base substrate 100 and patterned to form the metal light-shielding layer 200.

In at least one embodiment of the present disclosure, there is no limitation on the material of the base substrate. For example, the base substrate 100 is a transparent substrate and is, for example, formed of glass or transparent resin or the like.

In at least one embodiment of the present disclosure, no limitation is imposed on the material for manufacturing the metal light-shielding layer. For example, the material of the metal light-shielding layer 200 is a metal material that is capable of shielding light. For example, the material of the metal light-shielding layer 200 includes a metal material such as molybdenum, titanium, copper, chromium or an alloy material formed of the above metals. For example, the alloy material includes a copper-based alloy material including copper-molybdenum alloy (CuMo), copper-titanium alloy (CuTi), copper-molybdenum-titanium alloy (CuMoTi), copper-molybdenum-tungsten alloy (CuMoW), copper-molybdenum-niobium alloy (CuMoNb), or the like; or the alloy material includes a chromium-based alloy material including chromium-molybdenum alloy (CrMo), chromium-titanium alloy (CrTi), chromium-molybdenum-titanium alloy (CrMoTi), or the like.

For example, in at least one embodiment of the present disclosure, the patterning process includes: coating a photoresist layer on a film which is to be patterned, exposing the photoresist layer using a mask, developing the photoresist layer which has been exposed to obtain a photoresist pattern, etching the film by using the photoresist pattern as a mask, and then removing the photoresist pattern optionally.

Figure 6B:
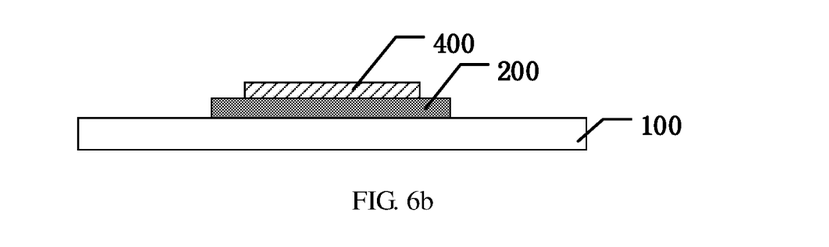

As shown in FIG. 6b, a spacer layer 400 is formed. For example, a spacer film is deposited on the base substrate 100 formed with the metal light-shielding layer 200 and is patterned by using a first mask to form the spacer layer 400.

Figure 6C:
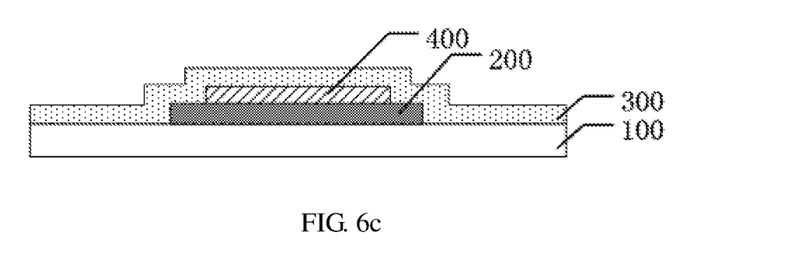

As shown in FIG. 6c, a buffer layer is formed. For example, the buffer layer 300 is formed on the base substrate 100 in way of depositing. For example, the material of the buffer layer 300 includes silicon oxide (SiOx) or silicon nitride (SiNx). For example, the buffer layer 300 has a single layer structure formed of silicon nitride or silicon oxide, or has a double layer structure formed of silicon nitride and silicon oxide.

Figure 6D:
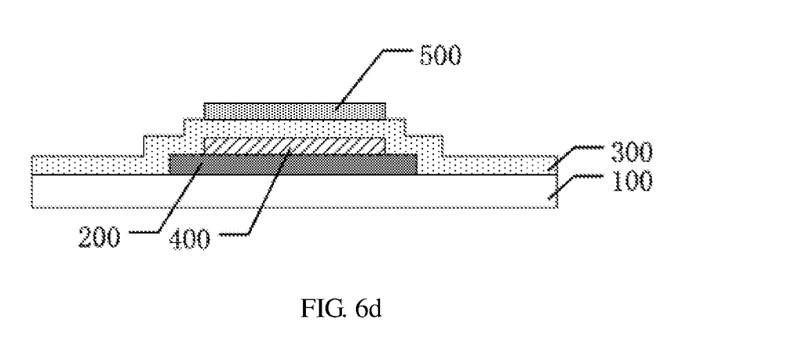

As shown in FIG. 6d, a first active layer is formed. For example, a first semiconductor film is deposited on the base substrate 100 and is subjected to a patterning process to form the first active layer 500. For example, the first semiconductor film is subjected to the patterning process by using the above-mentioned first mask to form the first active layer 500.

In at least one embodiment of the present disclosure, no limitation is imposed on the material of the first active layer. For example, the material of the first active layer 500 includes polysilicon, amorphous silicon, or an oxide semiconductor or the like. For example, the thickness of the first active layer 500 ranges from 40 to 50 nanometers. Taking the first active layer 500 being formed of polysilicon as an example, in at least one embodiment of the present disclosure, the process of forming the first active layer 500 includes: forming an amorphous silicon film on the buffer layer 300; annealing the amorphous silicon film to reduce the hydrogen content in the amorphous silicon film, in which the hydrogen content is controlled to be less than an atomic percent of 2%, for example; changing the amorphous silicon film into a polysilicon film by performing, for example, an excimer laser annealing process on the amorphous silicon film; then, performing a patterning process on the polysilicon film to form the first active layer 500.

It should be noted that, in at least one embodiment of the present disclosure, the spacer layer 400 is formed between the buffer layer 300 and the first active layer 500, for example. Taking the spacer layer 400 serving as a second active layer as an example, for example, a second semiconductor film and a first semiconductor film are sequentially deposited on the buffer layer 300, and a resistivity of the second semiconductor film is greater than a resistivity of the first semiconductor film; and then the second semiconductor film and the first semiconductor film are both subjected to a patterning process by using the first mask to form the second active layer 400 and the first active layer 500, respectively. For example, in at least one embodiment of the present disclosure, an amorphous silicon film is deposited on the buffer layer 300; then a portion, away from the base substrate 100, of the amorphous silicon film is processed to form polysilicon by, for example, excimer laser annealing, and this polysilicon is used to form the first active layer 500.

A portion, close to the base substrate 100, of the amorphous silicon film is not annealed and is still amorphous silicon, so that this portion is used to form the second active layer 400.

Figure 6E:
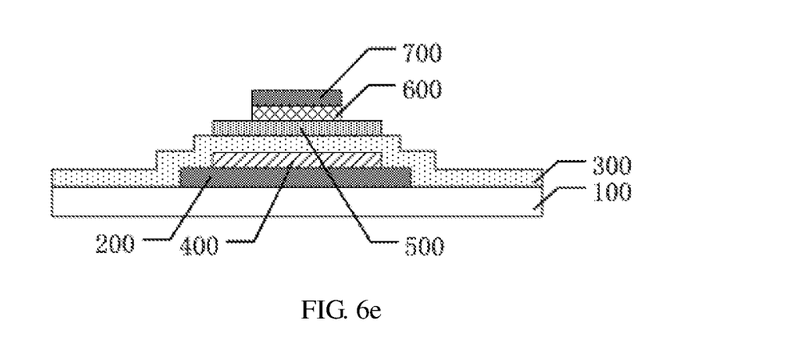

As shown in FIG. 6e, a gate insulating film and a gate conductive film are sequentially deposited on the base substrate 100 and then are subjected to a patterning process to form a gate insulating layer 600 and a gate electrode 700, respectively.

It should be noted that, in at least one embodiment of the present disclosure, for example, the gate insulating layer 600 and the gate electrode 700 are formed by patterning processes, respectively; that is, the gate insulating film is deposited on the base substrate 100 and then is subjected to a patterning process to form the gate insulating layer 600; then a gate conductive film is deposited on the base substrate 100 and then is subjected to a patterning process to form the gate electrode 700.

In at least one embodiment of the present disclosure, the material of the gate insulating layer is not limited. For example, the material of the gate insulating layer 600 includes silicon nitride (SiNx), silicon oxide (SiOx), aluminum oxide ($Al_2O_3$), or aluminum nitride (AlN), or other suitable materials.

In at least one embodiment of the present disclosure, the material of the gate electrode is not limited. For example, the material of the gate electrode 700 includes a copper-based metal, for example, copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W), or copper-molybdenum-niobium alloy (Cu/Mo/Nb), or the like; or the material of the gate electrode 700 includes a chromium-based metal, for example, chromium-molybdenum alloy (Cr/Mo), chromium-titanium alloy (Cr/Ti), or chromium-molybdenum-titanium alloy (Cr/Mo/Ti), or the like; or the material of the gate electrode 700 includes aluminum or aluminum alloy or the like.

Figure 6F:
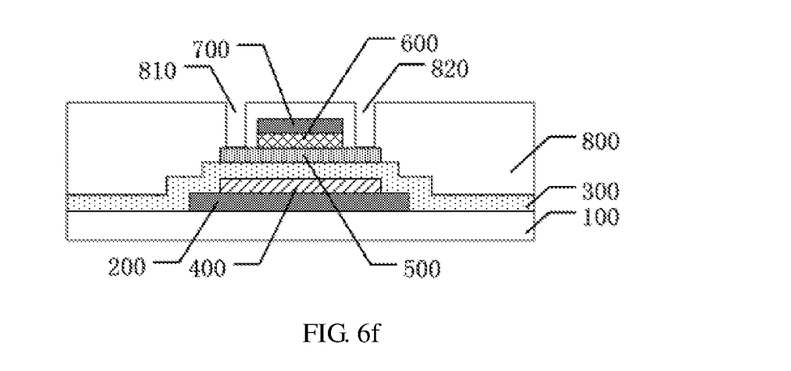

As shown in FIG. 6f, an insulating material film is deposited on the base substrate 100 to form an interlayer dielectric layer 800, and then a patterning process is performed on the interlayer dielectric layer 800 to form, for example, a first via hole 810 and a second via hole 820 in the interlayer dielectric layer 800. For example, the first via hole 810 and the second via hole 820 respectively expose portions of the first active layer 500.

In at least one embodiment of the present disclosure, no limitation is imposed on the structure and material of the interlayer dielectric layer. For example, the interlayer dielectric layer 800 has a structure of a single layer, or has a structure of two or more layers. The material of the interlayer dielectric layer 800 includes an inorganic insulating material such as silicon nitride or silicon oxide or the like, or includes an organic insulating material.

As shown in FIG. 2a, a conductive film is deposited on the base substrate 100 and is subjected to a patterning process to form a source/drain electrode layer 900, and the source/drain electrode layer 900 includes a source electrode 910 and a drain electrode 920. For example, the source electrode 910 is electrically connected with the first active layer 500 through the first via hole 810, and the drain electrode 920 is electrically connected with the first active layer 500 through the second via hole 820.

In at least one embodiment of the present disclosure, there is no limitation on the material for preparing the source/drain electrode layer. For example, the material of the source/drain electrode layer 900 includes a metal material such as molybdenum, titanium, copper or chromium or an alloy material formed of the above metals. For example, the alloy material includes a copper-based alloy material including copper-molybdenum alloy (CuMo), copper-titanium alloy (CuTi), copper-molybdenum-titanium alloy (CuMoTi), copper-molybdenum-tungsten alloy (CuMoW), or copper-molybdenum-niobium alloy (CuMoNb), or the like; or the alloy material includes a chromium-based alloy material including chromium-molybdenum alloy (CrMo), chromium-titanium alloy (CrTi), or chromium-molybdenum-titanium alloy (CrMoTi), or the like At least one embodiment of the present disclosure provides a manufacturing method of an array substrate, the array substrate includes the thin film transistor described in any one of the above embodiments; for example, the thin film transistor is manufactured by using the manufacturing method described in any one of the above embodiments.

For example, the manufacturing method of the array substrate provided by at least one embodiment of the present disclosure further includes: forming a storage capacitor on the base substrate, and the storage capacitor includes a first electrode, a second electrode and a dielectric layer between the first electrode and the second electrode.

For example, the specific structure of the array substrate may be referred to the related content described in the foregoing embodiments (i.e. the embodiments of the array substrate), and details are not omitted herein.

FIG. 7a to FIG. 7f are process views of the manufacturing method of the array substrate provided by at least one embodiment of the present disclosure. Taking the structure of the array substrate shown in FIG. 5 as an example, for example, as shown in FIG. 7a to FIG. 7f, the manufacturing method of the array substrate in at least one embodiment of the present disclosure includes the following process.

Figure 7A:
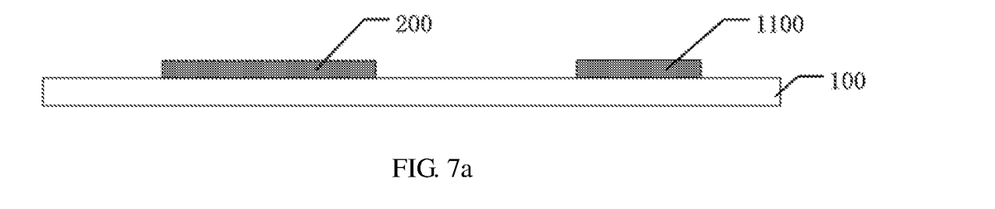
FIG. 7a to FIG. 7f are process views of a method for manufacturing the array substrate provided by at least one embodiment of the present disclosure.

As shown in FIG. 7a, a base substrate 100 is provided, and a metal material film is deposited on the base substrate 100 and is subjected to a patterning process to form a metal light-shielding layer 200 and a first electrode 1100.

Figure 7B:
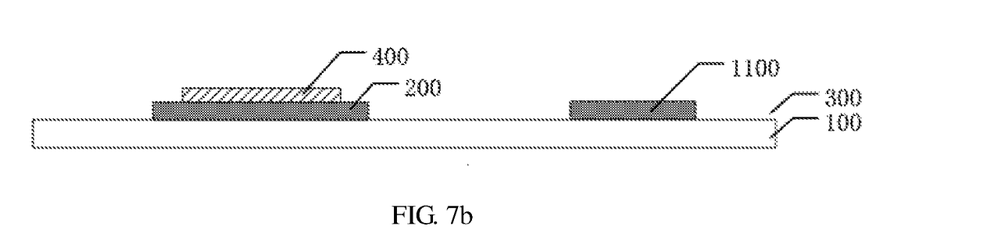

As shown in FIG. 7b, a spacer film is deposited on the base substrate 100 formed with the metal light-shielding layer 200 and is subjected to a patterning process by using a first mask to form a spacer layer 400. For example, in the embodiment of the present disclosure, the position of the spacer layer 400 is spaced apart from the arrangement position of the storage capacitor C.

Figure 7C:
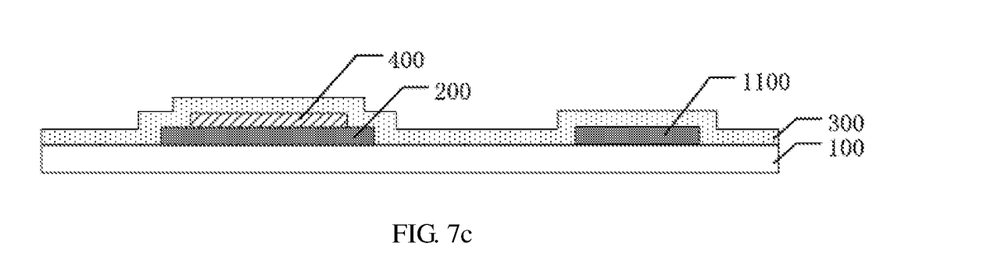

As shown in FIG. 7c, a buffer layer 300 is deposited on the base substrate 100. For example, a portion of the buffer layer 300 serves as a first dielectric layer of the storage capacitor C.

Figure 7D:
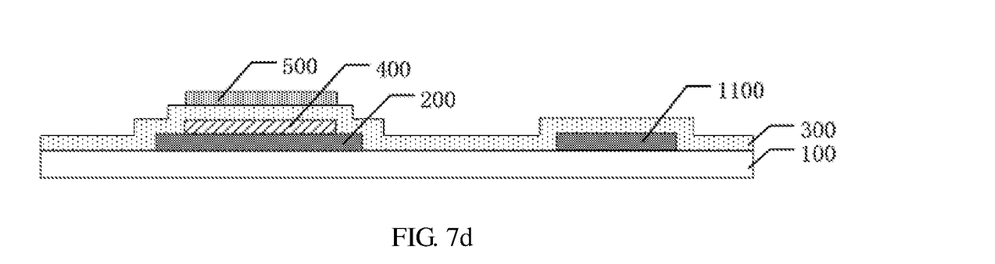

As shown in FIG. 7d, a first semiconductor film is deposited on the base substrate 100 and is subjected to a patterning process by using the first mask to form a first active layer 500.

Figure 7E:
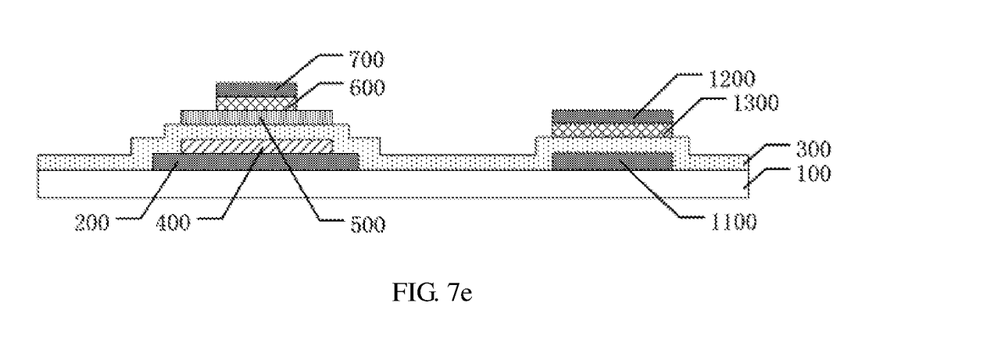

As shown in FIG. 7e, a gate insulating film and a gate conductive film are sequentially deposited on the base substrate 100 and then are subjected to a patterning process, so as to form a gate insulating layer 600 and a gate electrode 700 which are in the thin film transistor and a second dielectric layer 1300 and a second electrode 1200 which are in the storage capacitor C.

It should be noted that, in the case where the second dielectric layer 1300 does not need to be provided in the storage capacitor C, that is, only the buffer layer 300 serves as the dielectric layer of the storage capacitor C, the process of forming the gate insulating layer 600, the gate electrode 700 and the second electrode 1200 on the base substrate 100 includes: depositing the gate insulating film on the base substrate 100 and performing a patterning process on the gate insulating film to form the gate insulating layer 600 in the thin film transistor; and then depositing the gate conductive film on the base substrate 100 and performing a patterning process on the gate conductive film to form the gate electrode 700 in the thin film transistor and the second electrode 1200 in the storage capacitor C.

Figure 7F:
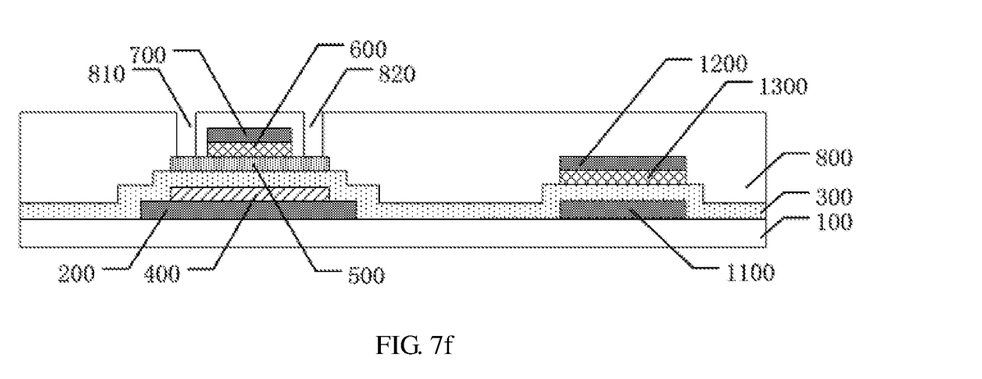

As shown in FIG. 7f, an interlayer dielectric layer 800 is formed on the base substrate 100, and then a patterning process is performed on the interlayer dielectric layer 800 to form, for example, a first via hole 810 and a second via hole 820 in the interlayer dielectric layer 800. For example, the first via hole 810 and the second via hole 820 respectively expose portions of the first active layer 500.

As shown in FIG. 5, a conductive film is deposited on the base substrate 100 and is subjected to a patterning process to form a source/drain electrode layer 900, and the source/drain electrode layer 900 includes a source electrode 910 and a drain electrode 920. For example, the source electrode 910 is electrically connected with the first active layer 500 through the first via hole 810, and the drain electrode 920 is electrically connected with the first active layer 500 through the second via hole 820.

At least one embodiment of the present disclosure provides the thin film transistor, the manufacturing method of the thin film transistor, the array substrate and the manufacturing method of the array substrate, and has at least one of the following advantageous effects.

(1) In the thin film transistor provided in at least one embodiment of the present disclosure, the spacer layer is provided between the channel region of the first active layer and the metal light-shielding layer, so that the distance between the channel region of the first active layer and the metal light-shielding layer is increased, which reduces or eliminates the parasitic capacitance between the channel region of the first active layer and the metal light-shielding layer and improves the electrical properties of the thin film transistor.

(2) In the manufacturing method of the thin film transistor provided by at least one embodiment of the present disclosure, for example, the first active layer and the spacer layer are manufactured by using the same mask, and thus the cost in the production process is reduced.

(3) In the array substrate provided by at least one embodiment of the present disclosure, the spacer layer is spaced apart from the storage capacitor, which reduces or eliminates the parasitic capacitance between the channel region of the first active layer in the thin film transistor and the metal light-shielding layer, without affecting the capacitance of the storage capacitor.

For the present disclosure, the following points need to be explained:

(1) The drawings of the embodiments of the present disclosure relate only to the structures involved in the embodiments of the present disclosure, and other structures may refer to normal designs.

(2) For the sake of clarity, in the drawings used for describing the embodiments of the present disclosure, the thicknesses of layers or regions are enlarged or reduced, that is, these drawings are not drawn in actual scale.

(3) In the case of no conflict, the embodiments of the present disclosure and the features in the embodiments can be combined with each other to obtain a new embodiment.

What are described above only relates to specific embodiments of the present disclosure, but the protection scope of the present disclosure is not limited thereto, and the protection scope of the present disclosure should be defined by the accompanying claims.

What is claimed is:

1. A thin film transistor, comprising:
   a base substrate;
   a metal light-shielding layer and a first active layer which are on the base substrate; and
   a spacer layer between the first active layer and the metal light-shielding layer, and
   a buffer layer between the first active layer and the metal light-shielding layer,
   wherein the first active layer comprises a channel region, and the spacer layer is between the channel region and the metal light-shielding layer, and
   the spacer layer serves as a second active layer, the second active layer is between the first active layer and the buffer layer, and a resistivity of the second active layer is greater than a resistivity of the first active layer.

2. The thin film transistor according to claim 1, wherein in a direction perpendicular to the base substrate, an orthographic projection of the spacer layer on the base substrate at least partially overlaps an orthographic projection of the channel region of the first active layer on the base substrate.

3. The thin film transistor according to claim 2, wherein in the direction perpendicular to the base substrate, the orthographic projection of the spacer layer on the base substrate completely overlaps the orthographic projection of the channel region of the first active layer on the base substrate.

4. The thin film transistor according to claim 2, wherein in the direction perpendicular to the base substrate, the orthographic projection of the spacer layer on the base substrate completely overlaps an orthographic projection of the first active layer on the base substrate.

5. An array substrate, comprising a thin film transistor, wherein the thin film transistor comprises:
   a base substrate;
   a metal light-shielding layer and a first active layer which are on the base substrate; and
   a spacer layer between the first active layer and the metal light-shielding layer, and
   a buffer layer between the first active layer and the metal light-shielding layer,
   wherein the first active layer comprises a channel region, and the spacer layer is between the channel region and the metal light-shielding layer, and
   the spacer layer serves as a second active layer, the second active layer is between the first active layer and the buffer layer, and a resistivity of the second active layer is greater than a resistivity of the first active layer.

6. The array substrate according to claim 5, further comprising:
   a storage capacitor on the base substrate, wherein the storage capacitor comprises a first electrode, a second electrode and a dielectric layer between the first electrode and the second electrode.

7. The array substrate according to claim 6, wherein
   the metal light-shielding layer of the thin film transistor and the first electrode are in a same layer and are formed of a same material; and/or
   the thin film transistor comprises a gate electrode, and the gate electrode and the second electrode are in a same layer and are formed of a same material.

8. The array substrate according to claim 6, wherein
   the thin film transistor further comprises: a buffer layer between the first active layer and the metal light-shielding layer, and
   a portion of the buffer layer serves as the dielectric layer.

9. The array substrate according to claim 6, wherein the spacer layer and the storage capacitor are spaced apart from each other.

10. A manufacturing method of a thin film transistor, comprising:
    providing a base substrate;
    forming a light-shielding layer and a first active layer on the base substrate; and
    forming a spacer layer between the first active layer and the metal light-shielding layer; and
    forming a buffer layer between the first active layer and the metal light-shielding layer;
    wherein the first active layer comprises a channel region, and the spacer layer is formed between the channel region and the metal light-shielding layer;
    the spacer layer serves as a second active layer; and
    the second active layer is formed between the first active layer and the buffer layer, and a resistivity of the second active layer is greater than a resistivity of the first active layer.

11. The manufacturing method according to claim 10, wherein
    forming the first active layer on the base substrate comprises: forming a first semiconductor film on the base substrate, and patterning the first semiconductor film by using a first mask to form the first active layer; and
    forming the spacer layer on the base substrate comprises: forming a spacer film on the base substrate, and patterning the spacer film by using the first mask to form the spacer layer.

12. A manufacturing method of an array substrate, comprising the manufacturing method according to claim 10.

13. The manufacturing method according to claim 12, further comprising:
    forming a storage capacitor on the base substrate,
    wherein the storage capacitor comprises a first electrode, a second electrode, and a dielectric layer between the first electrode and the second electrode.

14. The manufacturing method according to claim 13, wherein the spacer layer and the storage capacitor are spaced apart from each other.

* * * * *